United States Patent
Lee et al.

(10) Patent No.: US 10,581,008 B2
(45) Date of Patent: Mar. 3, 2020

(54) METHOD OF MANUFACTURING QUANTUM DOT HAVING TUNABLE AND NARROW LIGHT EMISSION WAVELENGTH FOR ACHIEVING HIGH COLOR PURITY AND A METHOD OF MANUFACTURING FILM

(71) Applicant: DAEGU GYEONGBUK INSTITUTE OF SCIENCE & TECHNOLOGY, Daegu (KR)

(72) Inventors: Jong Soo Lee, Daegu (KR); Parthiban Ramasamy, Daegu (KR)

(73) Assignee: DAEGU GYEONGBUK INSTITUTE OF SCIENCE & TECHNOLOGY, Daegu (KR)

(*) Notice: Subject to any disclaimer, the term of this patent is extended or adjusted under 35 U.S.C. 154(b) by 0 days.

(21) Appl. No.: 15/947,537

(22) Filed: Apr. 6, 2018

(65) Prior Publication Data
US 2018/0375046 A1 Dec. 27, 2018

(30) Foreign Application Priority Data

Jun. 22, 2017 (KR) .................. 10-2017-0079391
Dec. 19, 2017 (KR) .................. 10-2017-0175583

(51) Int. Cl.
*H01L 51/50* (2006.01)
*C09K 11/02* (2006.01)
(Continued)

(52) U.S. Cl.
CPC .......... *H01L 51/502* (2013.01); *C09K 11/02* (2013.01); *C09K 11/565* (2013.01); *B82Y 20/00* (2013.01); *B82Y 30/00* (2013.01); *B82Y 40/00* (2013.01)

(58) Field of Classification Search
CPC ..................................................... H01L 51/502
(Continued)

(56) References Cited

U.S. PATENT DOCUMENTS

2003/0010987 A1* 1/2003 Banin ............... B82Y 20/00
                                                       257/82
2015/0083969 A1* 3/2015 Kim ................. C09K 11/025
                                                       252/301.65
(Continued)

FOREIGN PATENT DOCUMENTS

KR       10-2014-0121217 A    10/2014
KR          10-1665450 B1     10/2016

OTHER PUBLICATIONS

Xi et al., "Understanding the Role of Single Molecular ZnS Precursors in the Synthesis of In(Zn)P/ZnS Nanocrystals", ACS Applied Materials & Interfaces, 2014, pp. 18233-18242, vol. 6.

*Primary Examiner* — Jami Valentine Miller
(74) *Attorney, Agent, or Firm* — Buchanan Ingersoll & Rooney PC

(57) ABSTRACT

The present disclosure relates to a method of manufacturing a quantum dot having a tunable and narrow light emission wavelength for achieving a high color purity, which for example includes preparing a mixture by dissolving an indium precursor and a zinc precursor in an acid, forming an In(Zn)P-based core by adding a phosphorus compound to the mixture, forming a first shell coated on the In(Zn)P-based core by adding a selenium compound and the zinc precursor to the mixture, and forming a second shell coated on the first shell by adding a sulfur compound and the zinc precursor to the mixture and in which the first shell is formed of ZnSe and the second shell is formed of ZnS.

20 Claims, 12 Drawing Sheets

(51) Int. Cl.
  *C09K 11/56* (2006.01)
  *B82Y 40/00* (2011.01)
  *B82Y 20/00* (2011.01)
  *B82Y 30/00* (2011.01)

(58) Field of Classification Search
  USPC ............................................ 257/13; 438/20
  See application file for complete search history.

(56) References Cited

U.S. PATENT DOCUMENTS

| | | | |
|---|---|---|---|
| 2018/0033856 A1* | 2/2018 | Kwon | C09K 11/70 |
| 2018/0327664 A1* | 11/2018 | Houtepen | C09K 11/02 |
| 2018/0375046 A1* | 12/2018 | Lee | H01L 51/502 |
| 2019/0040313 A1* | 2/2019 | Pousthomis | C09K 11/06 |
| 2019/0211260 A1* | 7/2019 | Won | C09K 11/883 |

* cited by examiner

METHOD OF MANUFACTURING QUANTUM DOT HAVING TUNABLE AND NARROW LIGHT EMISSION WAVELENGTH FOR ACHIEVING HIGH COLOR PURITY AND A METHOD OF MANUFACTURING FILM

CROSS-REFERENCE TO RELATED APPLICATION

This application claims priority to and the benefit of Korean Patent Application No. 10-2017-0079391, filed on Jun. 22, 2017 and No. 10-2017-0175583, filed on Dec. 19, 2017, the disclosure of which is incorporated herein by reference in its entirety.

BACKGROUND OF THE INVENTION

Field of the Invention

The present invention relates to a quantum dot, and more particularly, to a method of manufacturing a quantum dot having a tunable and narrow light emission wavelength for achieving a high color purity and a method of manufacturing a film.

Description of the Related Art

Quantum dots (QDs) are semiconducting nano-sized particles having a three-dimensionally limited size and exhibit excellent optical and electrical characteristics that are not possessed by semiconducting materials in a bulk state. For example, the color of light emitted from quantum dots may vary depending on the particle size although the quantum dots are produced from the same substance. Because of such characteristics, quantum dots are attracting attention as next generation high-brightness light emitting diodes (LEDs), bio sensors, lasers, and solar cell nanomaterials.

Currently, non-hydrolytic synthesis is a commonly used manufacturing method for forming quantum dots. According to this method, quantum dots have been manufactured by rapidly injecting an organic metal compound at room temperature as a precursor into a solvent at a high temperature to produce nuclei by the thermal decomposition reaction and then increasing the temperature to grow the nuclei. The quantum dots to be mainly synthesized by this method contain cadmium (Cd) such as cadmium selenide (CdSe) or cadmium tellurium (CdTe). However, the use of cadmium (Cd), one of the representative environmental pollutants which pollute water and soil, is required to be minimized when the current trend of pursuing the green industry by heightened environmental awareness is taken into consideration.

Hence, it is considered to manufacture quantum dots of semiconductor material which does not contain cadmium as an alternative for replacing existing CdSe quantum dots or CdTe quantum dots, and indium phosphide (InP) quantum dots are one of these. InP quantum dots can replace the CdSe quantum dot material and be used in the manufacture of a high-brightness light emitting diode device and the like as the InP quantum dots can emit light in a visible light region which is a light emission region similar to that of the CdSe quantum dot material.

However, InP quantum dots have a disadvantage that it is not only difficult to mass-produce InP quantum dots since the synthesis thereof is generally difficult but also the uniformity of particle size is more hardly secured and the quantum yield (QY) is lower as compared with the existing CdSe quantum dot material.

As a measure to solve the above-mentioned disadvantages of InP quantum dots, there is a method in which a shell formed of a II-VI group compound having a band gap larger than that of the core such as zinc sulfide (ZnS) is coated on the surface of the InP core. It is possible to solve the problem that it is difficult to maintain the light emission stability or to control the size of the InP quantum dots, which is a III-V group compound, to a certain extent when the InP core is coated with a II-VI group compound shell having a band gap larger than that of the core. However, problems such as productivity (reaction time), manufacturing cost and environment (amount of sample, odor, and the like), and securement of coating uniformity are required to be sufficiently considered even when coating the shell. Not only the light emission efficiency of the quantum dots decreases but the light emission characteristics are significantly sensitive to the change of the surface molecules in some cases when the shell is not properly formed.

CITATION LIST

Patent literature

Patent Literature 1: Korean Patent No. 10-1665450

SUMMARY OF THE INVENTION

The technical object of the present invention is to solve the problem that the absorption characteristics of an InP QD core deteriorate and a wider light emission line width is caused when a zinc precursor is added during the formation of a shell located on the core in a conventional manufacturing method for synthesizing a quantum dot and to provide a method of manufacturing a quantum dot having a tunable and narrow light emission wavelength for achieving a high color purity and a method of manufacturing a film.

The technical object of the present invention is not limited to the above-described technical object, and other technical objects that are not mentioned above may be clearly understood by those skilled in the art from the following description.

In order to achieve the technical object, an embodiment of the present invention provides a method of manufacturing a quantum dot. The method of manufacturing a quantum dot may comprise: preparing a mixture by dissolving an indium precursor and a zinc precursor in an acid; forming an In(Zn)P-based core by adding a phosphorus compound to the mixture; forming a first shell coated on the In(Zn)P-based core by adding a selenium compound and the zinc precursor to the mixture; and forming a second shell coated on the first shell by adding a sulfur compound and the zinc precursor to the mixture, and the first shell may be formed of ZnSe and the second shell may be formed of ZnS in the method.

The indium precursor may include indium acetate or indium acetylacetonate.

The zinc precursor may include one or more kinds selected from zinc acetate, zinc acetylacetonate, zinc stearate, or zinc oleate.

The acid may include a carboxylic acid ligand.

The carboxylic acid ligand may include palmitic acid, stearic acid, myristic acid, or oleic acid.

The zinc precursor may be injected by from 0.5 mmol to 2 mmol based on 1 mmol of the indium precursor.

The acid may be injected by from 3.8 mmol to 4 mmol based on 1 mmol of the indium precursor in the step of preparing a mixture.

The step of preparing a mixture may be conducted in a vacuum at from 100° C. to 140° C. for 6 hours or longer.

The phosphorus (P) compound may be injected by from 0.5 mmol to 1 mmol based on 1 mmol of the indium precursor in the step of forming a core.

The phosphorus compound may include tris(trimethylsilyl)phosphine ((TMS)3P).

The phosphorus compound may be added and the state may be then maintained at a temperature of from 200° C. to 400° C. for from 10 minutes to 30 minutes in the step of forming a core.

A core may be formed by conducting a heating-up method in the step of forming a core.

The heating-up method may be conducted at a temperature of 400° C. or lower.

The selenium compound may include TOP (trioctylphosphine)Se.

The sulfur compound may include 1-dodecanethiol (1-DDT).

The first shell and the second shell may be formed by conducting a successive ion layer adsorption and reaction (SILAR) method.

The SILAR (successive ion layer adsorption and reaction) method may be conducted at a temperature of from 200° C. to 400° C.

At least two or more layers of shells including the first shell and the second shell may be coated.

The size of the quantum dot may be from 1.6 nm to 6 nm.

The light emission wavelength of the quantum dot may emit light at a wavelength of from 380 nm to 750 nm.

In order to accomplish the technical object, another embodiment of the present invention provides a quantum dot. This quantum dot includes an In(Zn)P-based core which emits light of different colors depending on its size, a first shell which has a band gap larger than that of the core so as to emit light brightly and is coated on the core, and a second shell which protects the core from being oxidized from the outside and is coated on the first shell, and the first shell is formed of ZnSe and the second shell is formed of ZnS in this quantum dot.

DETAILED DESCRIPTION OF THE PREFERRED EMBODIMENTS

Figure 1:
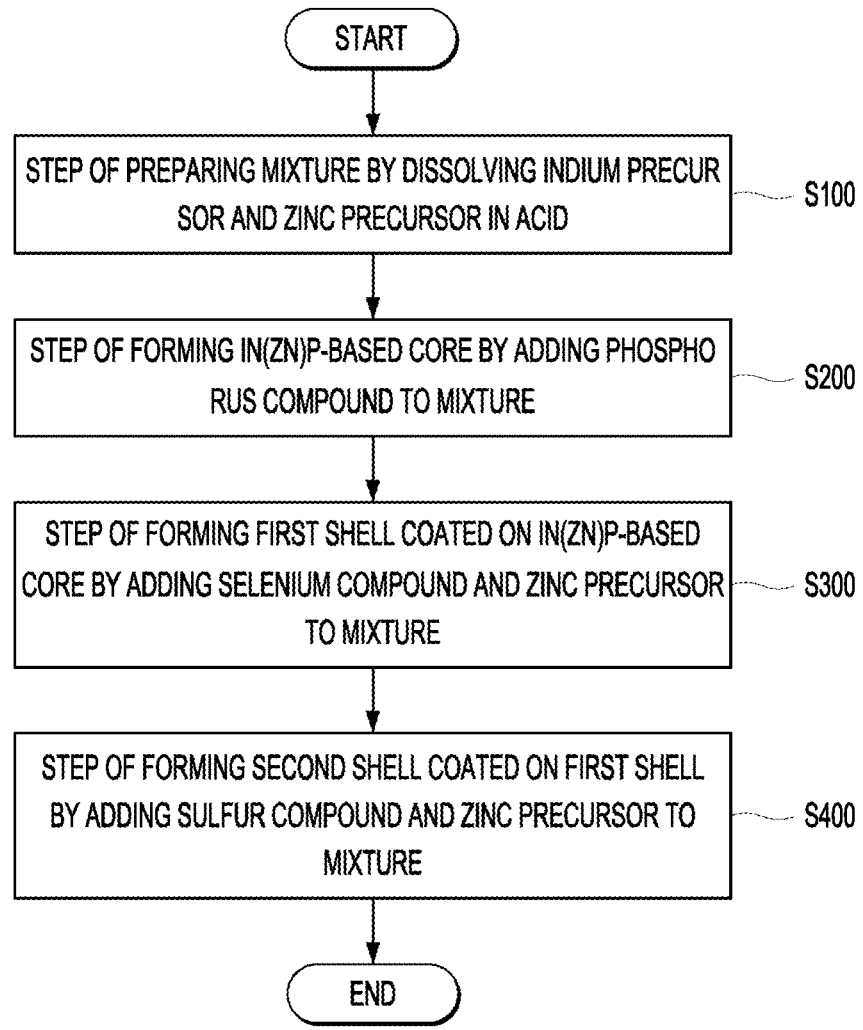
FIG. 1 is a flowchart illustrating a method of manufacturing a quantum dot according to the present invention.

Hereinafter, the present invention will be described with reference to the accompanying drawings. The present invention may, however, be embodied in many different forms and should not be construed as limited to the embodiments set forth herein. In order to clearly illustrate the present invention, parts not related to the description are omitted and like parts are denoted by like reference numerals throughout the specification.

Throughout the specification, when a part is referred to as being "connected" (accessed, in contact, coupled) with another part, this includes not only being "directly connected" but also being "indirectly connected" to have still another member in between. In addition, when a part is referred to as "including" an element, this means that other elements are not excluded but may be further included unless specifically stated otherwise.

The terminology used herein is for the purpose of describing particular embodiments only and is not intended to be limiting of the invention. The singular forms "a," "an," and "the" include plural referents unless the context clearly dictates otherwise. In this specification, it is to be understood that the terms "include" or "have", and the like are intended to specify the presence of stated features, numbers, steps, operations, elements, parts, or combinations thereof but do not preclude the presence or addition of one or more other features, numbers, steps, operations, elements, parts, or combinations thereof.

Hereinafter, an embodiment of the process of manufacturing a quantum dot according to the present invention will be described in detail with reference to the accompanying drawings.

FIG. 1 is a flowchart illustrating a method of manufacturing a quantum dot according to an embodiment of the present invention.

Referring to FIG. 1, a method of manufacturing a quantum dot according to an embodiment of the present invention includes a step (S100) of preparing a mixture by dissolving an indium precursor and a zinc precursor in an acid, a step (S200) of forming an In(Zn)P-based core by adding a phosphorus compound to the mixture, a step (S300) of forming a first shell coated on the In(Zn)P-based core by adding a selenium compound and the zinc precursor to the mixture, and a step (S400) of forming a second shell coated on the first shell by adding a sulfur compound and the zinc precursor to the mixture, and the first shell is formed of ZnSe and the second shell is formed of ZnS in the method.

First, a mixture is prepared by dissolving an indium precursor and a zinc precursor in an acid (S100).

The indium precursor may include indium acetate or indium acetylacetonate.

The zinc precursor may include one or more kinds selected from zinc acetate, zinc acetylacetonate, zinc stearate, or zinc oleate.

The acid may include a carboxylic acid ligand.

In addition, the carboxylic acid ligand may include palmitic acid, stearic acid, myristic acid, or oleic acid.

In an embodiment of the present invention, indium acetate and zinc acetate are dissolved in palmitic acid to form a mixture, but the present invention is not limited thereto.

The zinc precursor may be injected by from 0.5 mmol to 2 mmol based on 1 mmol of the indium precursor in the step of preparing a mixture.

By adding a zinc precursor, it is possible to incorporate the zinc precursor into the core surface during quantum dot growth, to smooth the lattice parameter at the interface between the core and the shell, and thus to facilitate uniform coating.

In addition, it is confirmed that the blue shift and the absorption spectrum expand and the full width at half maximum (FWHM) of the quantum dots thus increases by the addition of a zinc precursor.

The acid may be injected by from 3.8 mmol to 4 mmol based on 1 mmol of the indium precursor in the step of preparing a mixture.

For example, the ratio of indium precursor:zinc precursor:acid may be from 1:0.5:3.8 to 1:0.5:4 and more preferably the ratio of indium precursor:zinc precursor:palmitic acid may be 1:0.5:3.9.

The step of preparing a mixture may be conducted in a vacuum at from 100° C. to 140° C. for 6 hours or longer.

More preferably, it may be conducted in a vacuum at 120° C. for 12 hours.

Next, a phosphorus compound is added to the mixture to form an In(Zn)P core (S200).

In the step of forming a core (S200), the phosphorus compound may be injected by from 0.5 mmol to 1 mmol based on 1 mmol of the indium precursor.

For example, the phosphorus compound may be trioctylphosphine (TOP) and the mixture with the phosphorus precursor may be prepared in an amount of from 0.5 ml to 2 ml.

It can be observed that a blue shift of the peak occurs and a narrow size distribution is obtained when the concentration of phosphorus increases in the absorption spectrum by an increase in the ratio of phosphorus (P).

In addition, the In(Zn)P core can solve the environmental problems caused by the use of conventional cores containing cadmium (Cd), has a wide light emission region from the visible light region to the near infrared region, has an excellent light emission efficiency because of the optical characteristics similar to a core containing cadmium (Cd), and thus can replace the cores containing cadmium (Cd).

The phosphorus (P) compound may include tris(trimethylsilyl)phosphine ((TMS)3P).

In addition, the phosphorus compound may be added and the state may be then maintained at a temperature of from 200° C. to 400° C. for from 10 minutes to 30 minutes in the step of forming a core (S200).

More preferably, the phosphorus compound may be injected at room temperature and the reaction temperature may be increased to 305° C. for 20 minutes.

In addition, the In(Zn)P core structure in the step of forming an In(Zn)P core may contain In (indium), Zn (zinc), and P (phosphorus) and may have an intermediate structure in which a Zn (zinc) layer is formed on the core surface, and the shape thereof may change in the next step.

The In(Zn)P core may emit light of different colors depending on its size.

For example, when the size of core is from 6 nm to 2 nm, red absorbing a longer wavelength is emitted as the size is larger and blue absorbing a shorter wavelength is emitted as the size is smaller.

A core may be formed by conducting a heating-up method in the step of forming a core.

The core may be uniformly grown by conducting the heating-up method.

Magic sized clusters (MSCs) are formed during the heating process when the heating-up method is used instead of the conventional hot-injection method.

In addition, the Ostwald ripening of a phenomenon in which the surface energy of particles becomes a driving force, particles smaller than the dispersion system become smaller or disappear, and thus a larger particle grows does not occur, resulting in a narrow size distribution in the absorption spectrum.

In addition, the synthesis using the heating-up method may be suitable for large-scale synthesis. It is possible to solve the synthesis problem due to the time and insufficient heat when synthesizing quantum dots by the conventional hot injection method.

The heating-up method may be conducted at a temperature of 400° C. or lower.

Next, a selenium compound and the zinc precursor are added to the mixture to form a first shell coated on the In(Zn)P-based core (S300).

The selenium compound includes TOP (trioctylphosphine)Se.

The zinc precursor includes one or more kinds selected from zinc acetate, zinc stearate, or zinc oleate.

In an embodiment of the present invention, the first shell surrounding the In(Zn)P core is formed as a ZnSe shell by adding TOPSe (trioctylphosphine-Se) and zinc stearate to the mixture and reacting them therein and then adding TOPSe (trioctylphosphine-Se) to the mixture one more time, but the present invention is not limited thereto.

In addition, TOP-Se may be synthesized and then injected directly into the In(Zn)P core.

In addition, the first shell is formed as a shell composed of an inorganic material in order to solve a problem that quantum dots composed only of a core are likely to be oxidized by the external environment and a problem that the quantum efficiency decreases by the electron-hole recombination due to defects or dangling bonds on the surface of the quantum dot core, to protect the core, and to maintain the efficiency.

Next, a sulfur compound and the zinc precursor are added to the mixture to form a second shell coated on the first shell (S400).

The sulfur compound includes 1-dodecanethiol (1-DDT).

The zinc precursor includes one or more kinds selected from zinc acetate, zinc stearate, or zinc oleate.

In an embodiment of the present invention, the second shell is formed as a ZnS shell by reacting 1-DDT (1-dodecanethiol) with Zn oleate, but the present invention is not limited thereto.

A successive ion layer adsorption and reaction (SILAR) method is used to form the first shell and the second shell.

The SILAR (successive ion layer adsorption and reaction) method is conducted at a temperature of from 200° C. to 400° C.

The SILAR (successive ion layer adsorption and reaction) method is a technique in which the substances are continuously injected into the core and reacted at a high temperature to conduct continuous ion layer adsorption and reaction, and the growth of quantum dots through the SILAR method can maintain a uniform size distribution.

For example, by repeatedly conducting the SILAR cycle seven times, it is possible to adjust the quantum dot absorption peak corresponding to the size increase from 1.8 nm to 3.6 nm to from 480 nm to 615 nm.

In addition, the shell protects the core of the quantum dot from being easily oxidized by oxygen and moisture to be provided from the outside and improves the light emission characteristics.

A method in which the shell improves the light emission characteristics may be to have a brighter band gap and thus to emit light brightly.

In addition, the chemical stability increases as the thickness of the shell increases, but optimization of the thickness is required to maximize the quantum efficiency of quantum dots.

In addition, an effect that the quantum efficiency is higher than the case of a single shell, the electron transporting property is improved, and the electron mobility is thus superior can be obtained as ZnSe/ZnS multiple shells are formed on the In(Zn)P core.

Hence, in the In(Zn)P/ZnSe/ZnS quantum dots, it is possible to solve the problem that a shell cannot be formed thick because of lattice mismatch when forming a first shell composed of II-VI group elements on an InP core composed of III-V group elements in the related art, to smooth the lattice parameter at the interface between the core and the shell, and thus to facilitate uniform coating as zinc (Zn) is incorporated into the surface during the core synthesis.

In addition, the multiple shells of the present invention in which the second shell is further formed can be formed to have a thick shell for protecting the core so that the problem that a core protecting effect and light stability and reliability decrease can be solved.

The size of the quantum dot may be from 1.6 nm to 6 nm.

The light emission wavelength of the quantum dot may emit light at a wavelength of from 380 nm to 750 nm.

The light emission wavelength may be a visible light wavelength band and may emit light at the light emission wavelength described above.

More preferably, the light emission wavelength of the quantum dot may be from 488 nm to 641 nm.

The quantum yield of the quantum dot may be 50% or more.

In addition, the quantum dots can have a quantum yield of 50% or more by the method of manufacturing a quantum dot of the present invention.

The synthesis in all the steps described above may be conducted in a single vessel.

An effect of being able to manufacture a quantum dot by a simple process is obtained as all the steps described above are carried out in a single vessel.

In addition, the quantum dot structure of the present invention manufactured by the method of manufacturing a quantum dot described above may include an In(Zn)P-based core which emits light of different colors depending on its size, a first shell which has a band gap larger than that of the core so as to emit light brightly and is coated on the core, and a second shell which protects the core from being oxidized from the outside and is coated on the first shell, and the first shell may be formed of ZnSe and the second shell may be formed of ZnS in this quantum dot structure.

In the In(Zn)P-based core, the In(Zn)P core structure may be a structure in which In (indium), Zn (zinc), and P (phosphorus) are contained in the core and a Zn (zinc) layer is formed on the core surface.

The size of the quantum dot may be from 1.6 nm to 6 nm.

The light emission wavelength of the quantum dot may emit light at a wavelength of from 380 nm to 750 nm.

The light emission wavelength may be a visible light wavelength band and may emit light at the light emission wavelength described above.

More preferably, the light emission wavelength of the quantum dot may be from 488 nm to 641 nm.

The quantum yield of the quantum dot may be 50% or more.

In addition, the quantum dots can have a quantum yield of 50% or more by the method of manufacturing a quantum dot of the present invention.

The ratio of indium to phosphorus in the core may be that the content of phosphorus is 0.5 mol % or 1 mol % based on 100 mol % of indium (In).

It can be observed that a blue shift of the peak occurs and a narrow size distribution is obtained when the concentration of phosphorus increases in the absorption spectrum by an increase in the ratio of phosphorus (P).

In addition, the In(Zn)P core can solve the environmental problems caused by the use of conventional cores containing cadmium (Cd), has a wide light emission region from the visible light region to the near infrared region, has an excellent light emission efficiency because of the optical characteristics similar to a core containing cadmium (Cd), and thus can replace the cores containing cadmium (Cd).

At least two or more layers of shells including the first shell and the second shell may be coated.

The present invention can provide a quantum dot manufactured by the method of manufacturing a quantum dot described above.

An effect that the light emission efficiency, color purity, and color reproducibility are excellent in a wide light emission region of from the visible light region to the near infrared region and an effect that the defects on the surface and inside of the core due to the external environment are prevented can be obtained by such a quantum dot.

Hereinafter, the method of manufacturing a quantum dot will be described in more detail with reference to FIG. 2.

Figure 2:
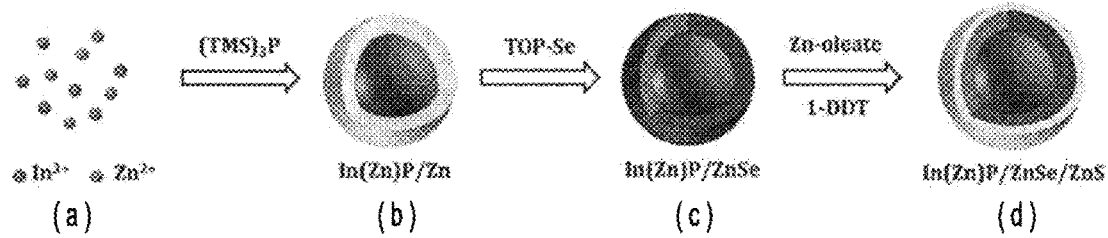
FIG. 2 is a schematic diagram illustrating the synthesis of In(Zn)P/ZnSe/ZnS QD of the present invention.

FIG. 2 is a schematic diagram illustrating the synthesis of In(Zn)P/ZnSe/ZnS QD of the present invention.

FIG. 2(a) is a schematic diagram illustrating a mixture in which an indium precursor ($In^{3+}$) and a zinc ion ($Zn^{2+}$) are dissolved in an acid.

The indium precursor ($In^{3+}$) and zinc ion ($Zn^{2+}$) of FIG. 2(a) may be derived from indium acetate and zinc acetate.

In the In(Zn)P/Zn quantum dots of FIG. 2(b), the In(Zn)P/Zn quantum dots are formed by adding tris(trimethylsilyl) phosphine ((TMS)3P) to FIG. 2(a) and a Zn layer is formed on the In(Zn)P-based core by adding a zinc ion to the In(Zn)P core.

In the In(Zn)P/ZnSe quantum dots of FIG. 2(c), a ZnSe shell is formed by adding TOP (trioctylphosphine)Se to FIG. 2(b).

Uniform coating of the ZnSe shell is possible as the Zn layer on the In(Zn)P-based core formed in FIG. 2(b) smooths the interface between the core and the ZnSe shell.

In the In(Zn)P/ZnSe/ZnS quantum dots of FIG. 2(d), a ZnS shell is formed by adding zinc oleate and 1-dodecanethiol (1-DDT) to FIG. 2(c).

The core can be protected from the external environment by the ZnSe/ZnS shell and provide a brighter light emission efficiency.

PREPARATION EXAMPLE 1

In(Zn)P/ZnSe/ZnS QDs Emitting at 535 nm (FWHM—38 nm)

1) 0.15 mmol of indium acetate, 0.075 mmol of zinc acetate, and 0.585 mmol of palmitic acid were mixed with 10 mL of ODE in a 50 mL three-necked flask and the flask was fixed to a Schlenk line by using a reflux condenser.

2) The mixture was heated at 120° C. for 12 hours in a vacuum state (vacuum level reaching 150 mTorr).

3) The flask was refilled with $N_2$ and cooled to room temperature. At this point, the mixture turned into a white turbid solution.

4) A solution containing 0.1 mmol of (TMS)3P and 1 mL of TOP (trioctylphosphine) was injected into the flask. After the injection, the mixture was heated to 305° C. and held at this temperature for 20 minutes.

5) 0.15 mL of TOP-Se in 0.1 mL of TOP was injected into the flask and the mixture was held at 300° C. for 15 minutes.

6) 0.1 mmol of zinc stearate in 1 mL of ODE was injected into the flask.

7) After the state was held for 10 minutes, 0.1 mL of TOP-Se in 0.1 mL of TOP was injected into the flask and the mixture was held at the same temperature for 15 minutes.

8) One or more ZnSe layers were coated by using Zn stearate and TOP-Se in the same amounts as those used in the previous steps.

9) The mixture was cooled to room temperature, 5 mL of 0.2 M Zn oleate was added thereto, and the mixture was held at 210° C. for 2 hours.

10) 2.5 mL of 1-DDT was added to the resultant mixture and the mixture was held at 260° C. for 2 hours to form an outer ZnS shell.

11) After being cooled to room temperature, QDs were precipitated with 50 mL of ethanol and collected through centrifugation at 6000 rpm for 30 minutes.

12) The QDs were washed with a dispersion in hexane three times, then precipitated by adding ethanol thereto, and stored in hexane in a vial in a glove box filled with $N_2$.

Meanwhile, the vacuum degree is preferably less than 150 mTorr and the vacuum time is preferably 12 hours when synthesizing In(Zn)P/ZnSe/ZnS QD having a FWHM of less than 40 nm.

PREPARATION EXAMPLE 2

Preparation of In(Zn)P/ZnS QDs Emitting at 488 nm (FWHM—35 nm)

In(Zn)P/ZnS QDs were prepared in the same manner as in Preparation Example 1 except that (TMS)3 was used by 0.1205 mmol (35 µl) instead of 0.1 mmol and TOP-S was used instead of TOP-Se.

PREPARATION EXAMPLE 3

Preparation of In(Zn)P/ZnSe/ZnS QDs Emitting at 515 nm (FWHM—36 nm)

In(Zn)P/ZnSe/ZnS QDs were prepared in the same manner as in Preparation Example 1 except that palmitic acid was used by 0.525 mmol instead of 0.575 mmol.

PREPARATION EXAMPLE 4

Preparation of In(Zn)P/ZnSe/ZnS QDs Emitting at 550 nm (FWHM—40 nm)

In(Zn)P/ZnSe/ZnS QDs were prepared in the same manner as in Preparation Example 1 except that palmitic acid was used by 0.625 mmol instead of 0.575 mmol.

COMPARATIVE EXAMPLE 1

Preparation of InP QDs 1) 0.15 mmol of indium acetate and 0.585 mmol of palmitic acid were mixed with 10 mL of ODE in a 50 mL three-necked flask and the flask was fixed to a Schlenk line by using a reflux condenser.

2) The mixture was heated at 120° C. for 12 hours in a vacuum state (vacuum level reaching 150 mTorr). Next, the flask was refilled with $N_2$ and cooled to room temperature. At this point, the mixture turned into a white turbid solution.

3) A solution containing 0.1 mmol of (TMS)3P (tris(trimethylsilyl)phosphine) was then rapidly injected into the flask.

4) After the injection, the mixture was heated to 305° C. (15° C./min). The mixture was then cooled to room temperature and held at this temperature for 2 minutes.

5) The quantum dots were precipitated with 50 mL of ethanol and collected through centrifugation at 6000 rpm for 30 minutes.

6) The InP quantum dots (InP QDs) were washed with a dispersion in hexane three times, then precipitated by adding ethanol thereto, and stored in hexane in a vial in a glove box filled with $N_2$.

COMPARATIVE EXAMPLE 2

Preparation of InP/ZnSe/ZnS QDs

1) InP core quantum dots were prepared in the same manner as in Comparative Example 1 described above.

2) Thereafter, the InP core quantum dots were held at 305° C. for 2 minutes, 0.1 mmol of zinc stearate in 1 mL of ODE was then injected into the flask containing the InP core quantum dots, and the mixture was held at 300° C. for 10 minutes.

3) Thereafter, 0.15 mL of TOP-Se in 0.1 mL of TOP was injected into the flask and the mixture was held at 300° C. for 15 minutes.

4) Thereafter, 0.1 mmol of zinc stearate in 1 mL of ODE was injected into the flask. After the state was held for 10 minutes, 0.1 mL of TOP-Se in 0.1 mL of TOP was injected into the flask and the mixture was held at the same temperature for 15 minutes.

5) One or more ZnSe layers were coated by using Zn stearate and TOP-Se in the same amounts as those used in the previous steps.

6) The mixture was then cooled to room temperature and 5 mL of 0.2M Zn oleate was added thereto, and the mixture was held at 210° C. for 2 hours.

7) Thereafter, 2.5 mL of 1-DDT was added to the resultant mixture and the mixture was held at 260° C. for 2 hours to form an outer ZnS shell. After being cooled to room temperature, QDs were precipitated with 50 mL of ethanol and collected through centrifugation at 6000 rpm for 15 minutes.

8) Thereafter, the QDs were washed with a dispersion in hexane three times, then precipitated by adding ethanol thereto, and stored in hexane in a vial in a glove box filled with $N_2$.

COMPARATIVE EXAMPLE 3

Large Size InP QDs Using SILAR Method

1) InP quantum dots having a size of 1.8 nm were synthesized according to Comparative Example 1.

2) After the synthesis, the mixture was cooled to 210° C., 1.5 mL of In(PA)3 was injected into the flask, and the mixture was held at 210° C. for 30 minutes and then cooled to room temperature.

3) A solution containing 0.1 mmol of (TMS)3P and 1 mL of TOP was then injected into the flask.

4) After the injection, the mixture was heated to 305° C. (15° C./min) and held at this temperature for 2 minutes. The InP layers were additionally coated by repeatedly conducting the same procedure.

COMPARATIVE EXAMPLE 4

InP/ZnSe/ZnS QDs Using SILAR Grown InP Core QDs (Em: 621 nm, FWHM: 44 nm)

1) InP quantum dots having a size of about 3 nm were synthesized by using the method according to Comparative Example 1 (5 layers).

2) After the core was synthesized, 0.25 mmol of zinc stearate in 1 mL of ODE was injected into the flask in which the core was synthesized, and the mixture was held at 300° C. for 10 minutes.

3) Thereafter, 0.5 mL of TOP-Se was injected into the flask and the mixture was held at the same temperature for 15 minutes.

4) Next, 0.25 mmol of zinc stearate in 1 mL of ODE was injected into the flask.

5) After the state was held for 10 minutes, 0.25 mL of TOP-Se in 0.25 mL of TOP was injected into the flask and the mixture was held at the same temperature for 15 minutes.

6) One or more ZnSe layers were coated by using Zn stearate and TOP-Se in the same amounts as those used in the previous steps. The mixture was then cooled to room temperature and 10 mL of 0.2M Zn oleate was added thereto, and the mixture was held at 210° C. for 2 hours.

7) Thereafter, 5 mL of 1-DDT (1-dodecanethiol) was added to the resultant mixture and the mixture was held at 260° C. for 2 hours to form an outer ZnS shell.

8) After being cooled to room temperature, QDs were precipitated with 50 mL of ethanol and collected through centrifugation at 6000 rpm for 30 minutes. The QDs were washed with a dispersion in hexane three times, then precipitated by adding ethanol thereto, and stored in hexane in a vial in a glove box filled with $N_2$.

EXPERIMENTAL EXAMPLE

1. UV-vis Absorption Spectroscopy

The absorbance spectrum of QD dispersed in hexane was measured by using a 1 cm long quartz cuvette and Cary 5000 UV-vis-NIR (Agilent Technologies) spectrophotometer.

2. Photoluminescence (PL) Spectroscopy and Quantum Yield Measurement

The PL spectrum of QD dispersed in toluene was measured by using Cary Eclipse fluorescence spectrophotometer ($\lambda$exc=400 nm). The absolute photoluminescence quantum yield of QDs was measured by using FluoroMax-4 spectrophotometer equipped with Quanta-phi integration accessory Horiba Jobin Yvon.

3. Time Resolved PL Spectra

Time-resolved PL spectra were measured by using a time-correlated single-photon counting system (Picoquant, Fluotime 200). The PL light emission from the sample was collected into a 1200 g/mm concave holographic lattice by a pair of lenses and detected by a photomultiplier tube (PMT). The time resolution and repetition rate are 80 ps and 10 MHz, respectively. Samples were prepared at 375 nm pulse (LDH-P-C-375, 3 μW) and room temperature.

4. X-ray Diffraction (XRD)

An X-ray diffraction pattern was acquired by using Rigaku MiniFlex 600 diffractometer equipped with a Cu Kα X-ray source ($\lambda$=1.5418 Å). Samples for XRD analysis were prepared by depositing (drop casting) QDs which were purified and dispersed in hexane on a glass substrate.

5. Transmission Electron Microscopy (TEM)

TEM and high-resolution TEM (HRTEM) images were acquired by using Hitachi HF-3300 microscope operating at 300 kV. A TEM sample was prepared by dropping diluted QDs on a carbon coated 200 mesh copper lattice.

6. Air Stability

The QDs in toluene were mixed with ODE (1:1 toluene: ODE) and stored outdoors.

7. Thermal Stability

The QDs were mixed with dry ODE and held at an ambient temperature of 150° C.

8. Procedure for Obtaining FWHM of Uv-vis Absorption Spectrum

The absorption spectrum was fitted to MATLAB by the following equation.

$$f(x, \sigma) = B + A\exp(-1*(x0-x)2/(2\sigma2))$$

A and x0 are respectively equal to the absorbance and energy at the lowest energy electron transition when B is equal to the absorbance energy at 800 nm. 2σ is the full width at half maximum of the absorbance peak.

Figure 3:
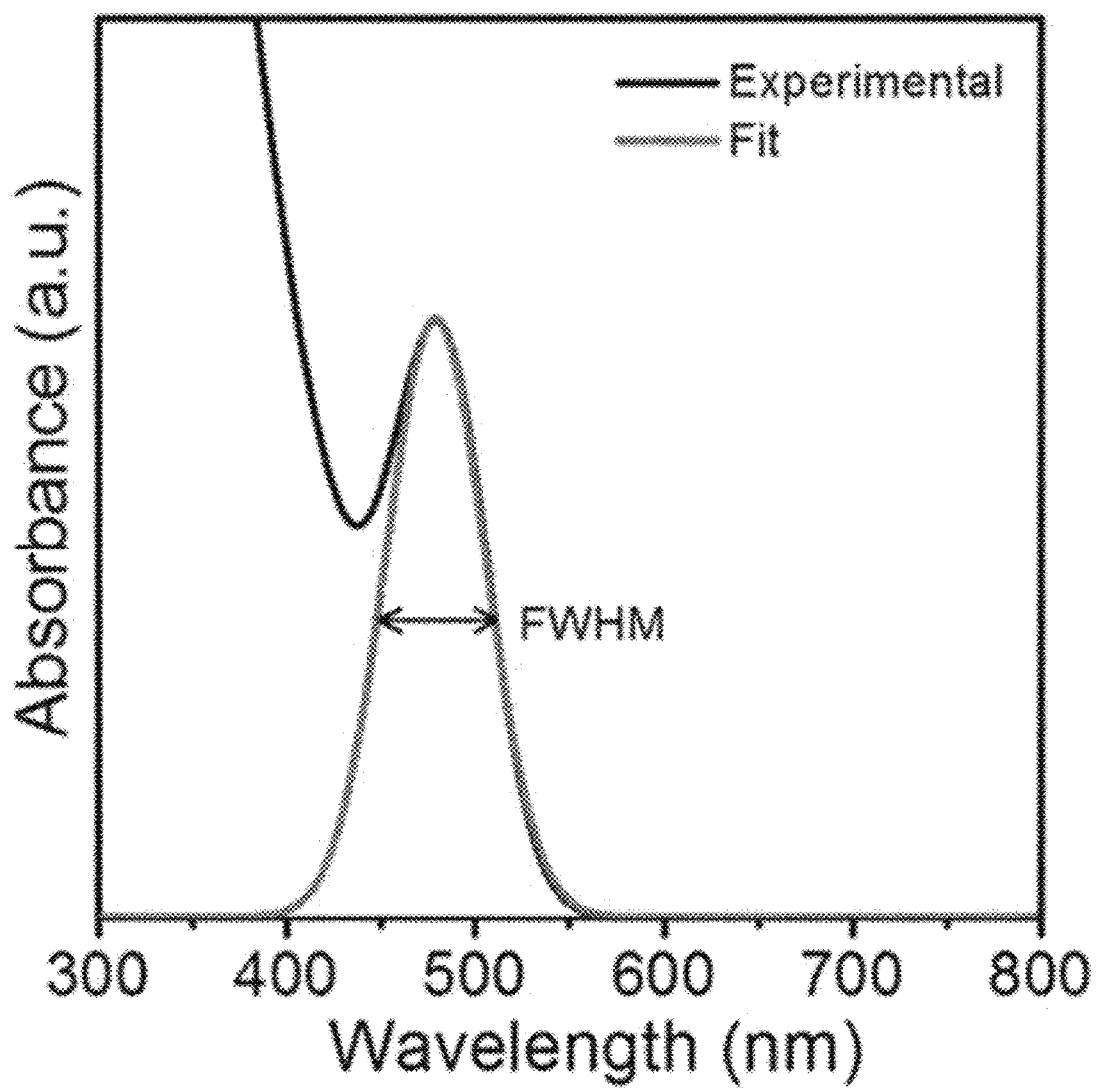
FIG. 3 is a graph illustrating an experimental absorption spectrum of InP QD.

FIG. 3 is a graph illustrating an experimental absorption spectrum of InP QD.

Referring to FIG. 3, the full width at half maximum (FWHM) of the fit graph of the spectrum of InP QD can be acquired and a graph illustrating the full width at half maximum of the core of to the present invention, InP QD, is confirmed.

Figure 4:
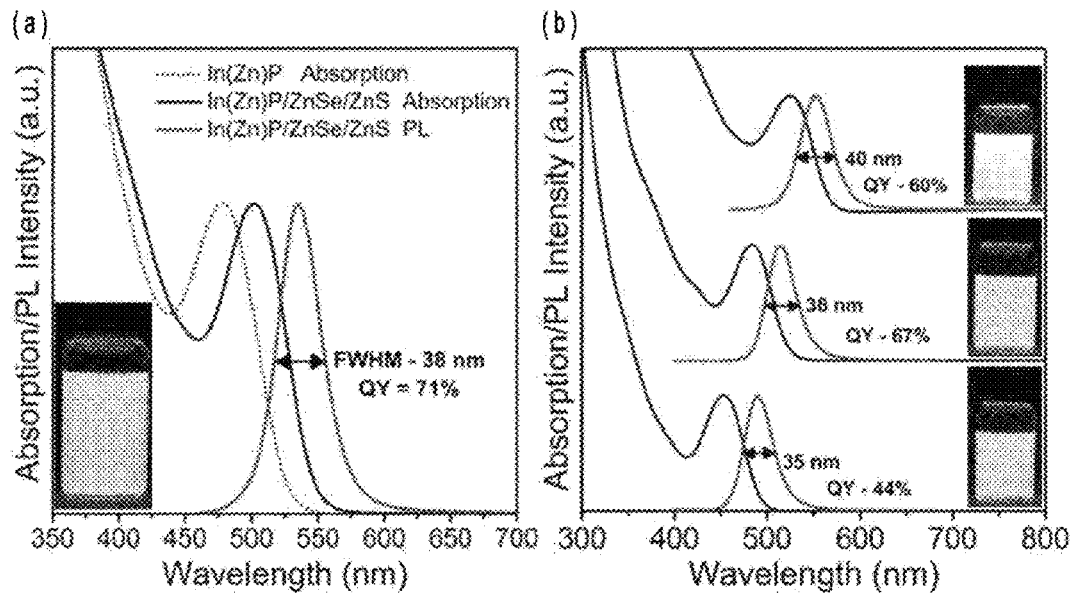
FIG. 4 is a graph illustrating the absorption intensity of In(Zn)P quantum dots of the present invention depending on the wavelength.

FIG. 4 is a graph illustrating the absorption intensity of In(Zn)P quantum dot of the present invention depending on the wavelength.

FIG. 4(a) is a graph illustrating the absorption intensity of In(Zn)P absorption, In(Zn)P/ZnSe/ZnS absorption, and In(Zn)P/ZnSe/ZnS PL depending on the wavelength.

When the graph of In(Zn)P absorption quantum dots composed only of a core is compared with the graph of In(Zn)P/ZnSe/ZnS absorption quantum dots composed of a core and multiple shells, the absorption and light emission spectra have a wider wavelength region in the graph of In(Zn)P/ZnSe/ZnS absorption quantum dots, and a superior effect can be thus obtained as more shells are formed.

In addition, the quantum yield of In(Zn)P/ZnSe/ZnS PL was 71% at a FWHM of 38 nm.

FIG. 4(b) is a graph illustrating the absorption intensity of In(Zn)P/ZnSe/ZnS QD which emits light at a FWHM of 35 nm, 36 nm, and 40 nm depending on the wavelength.

The highest quantum yield of 67% can be obtained at a FWHM of 36 nm.

A photograph of quantum dots which are irradiated with ultraviolet light from a UV lamp and emit light of different colors is also illustrated in FIG. 4.

Figure 5:
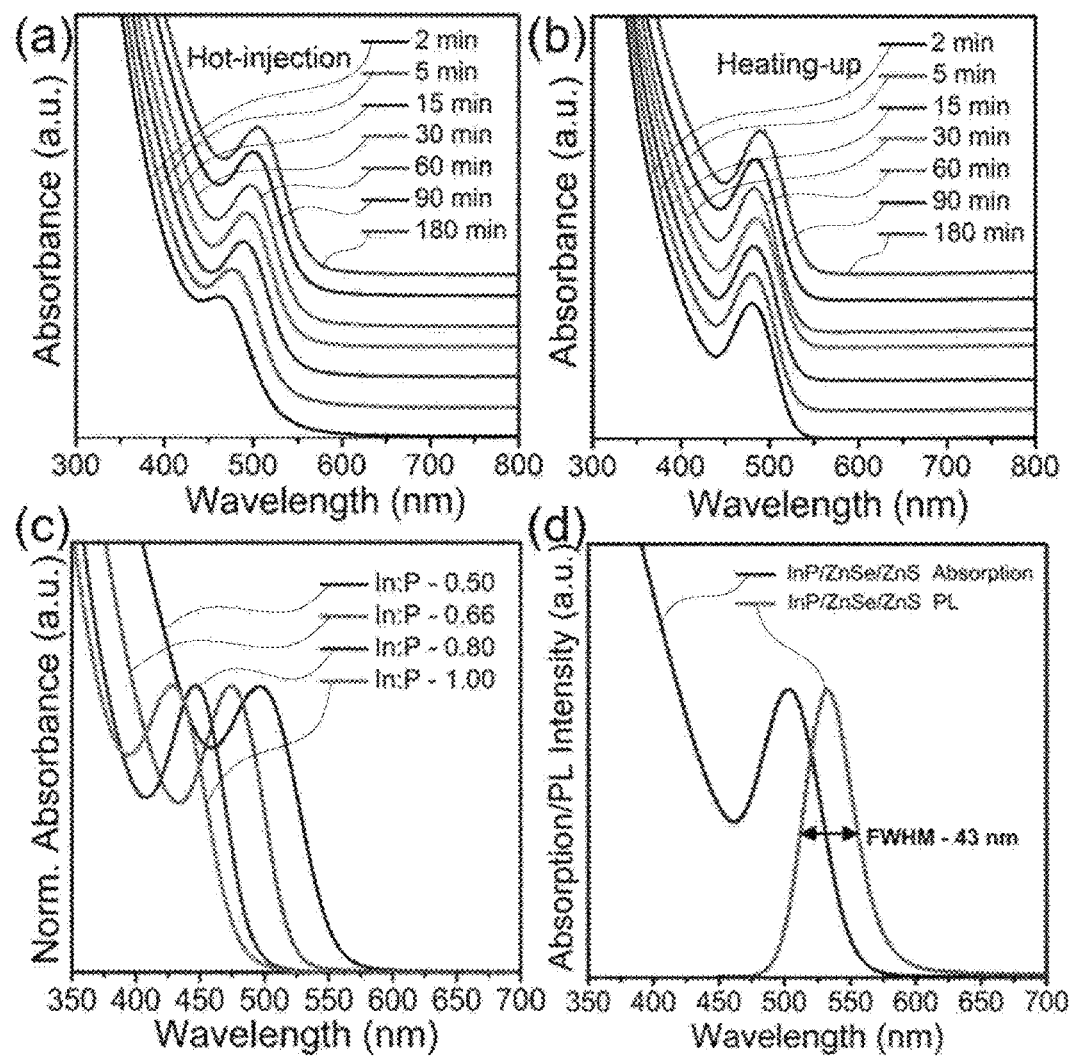
FIG. 5 is a graph illustrating the absorption spectra of quantum dots depending on the wavelength obtained during the growth of InP QDs by two different methods of the present invention.

FIG. 5 is a graph illustrating the absorption spectra of quantum dots depending on the wavelength obtained during the growth of InP QDs by two different methods of the present invention.

FIG. 5(a) is an absorption spectrum of quantum dots in which InP QDs are grown by a hot injection method depending on the wavelength, and FIG. 5(b) is an absorption spectrum of quantum dots in which InP QDs are grown by a heating-up method depending on the wavelength.

Comparing FIG. 5(a) with FIG. 5(b), the absorption spectrum of quantum dots obtained by a method in which the quantum dots are grown by a heating-up method is narrower and sharper than that of quantum dots obtained by a method in which the quantum dots are grown by a hot injection method, and a superior light emission efficiency is thus obtained from the quantum dots grown by a heating-up method.

When using a heating-up method but not a hot-injection method, magic sized clusters (MSCs) are generated during the heating process, thus the quantum dots are uniformly grown, and the growth of quantum dots is completed during the heating process.

In addition, the problem of Ostwald ripening caused when using the hot-injection method is solved when the heating-up method is used, and a spectrum having a narrow size distribution rather than a broad size distribution is observed in FIG. 5(a).

FIG. 5(c) illustrates the absorption intensity depending on the wavelength when the ratio of In (indium) to P (phosphorus) is 1.00, 0.80, 0.66, and 0.50.

The effect of the concentration of phosphorus precursor was studied by changing the ratio of In to P from 0.50 to 1. The blue shift of the absorption peak occurs when the concentration of phosphorus is increased, and InP quantum dots having a narrow size distribution can be obtained when In:P is 0.66 and 0.8.

FIG. 5(d) is a graph illustrating the absorption intensity at a FWHM of 43 nm of In(Zn)P/ZnSe/ZnS absorption and In(Zn)P/ZnSe/ZnS PL depending on the wavelength.

Hence, it is possible to further improve the light emission characteristics by coating the shell on the core by a heating-up method and optimizing the method to adjust the light emission intensity through adjustment of the ratio composition.

Figure 7:
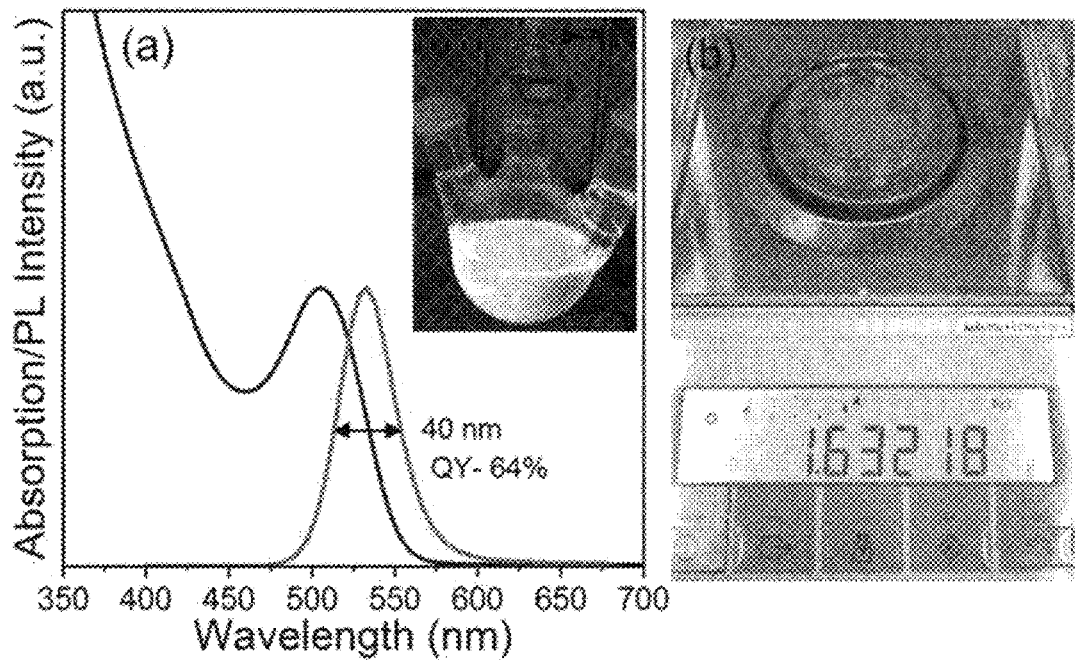
FIG. 7 is a graph and a photograph which illustrate the absorption and light emission spectra of In(Zn)P/ZnSe/ZnS QDs of the present invention and the amount of QD finally obtained.

FIG. 7 is a graph and a photograph which illustrate the absorption and light emission spectra of In(Zn)P/ZnSe/ZnS QDs of the present invention and the amount of QD finally obtained;

Referring to FIG. 7, FIG. 7(a) is a graph illustrating the absorption and light emission spectra of 1.63 g of In(Zn)P/ZnSe/ZnS QDs. It is confirmed that the full width at half maximum is 40 nm and a quantum yield (QY) of 64% is obtained, and a photograph of the reaction product under UV irradiation is also illustrated. From FIG. 7(b), it is confirmed that the QD finally obtained is 1.63 g.

FIGS. 6 and 8-10 are diagrams illustrating quantum dot characteristics of the present invention.

Figure 6:
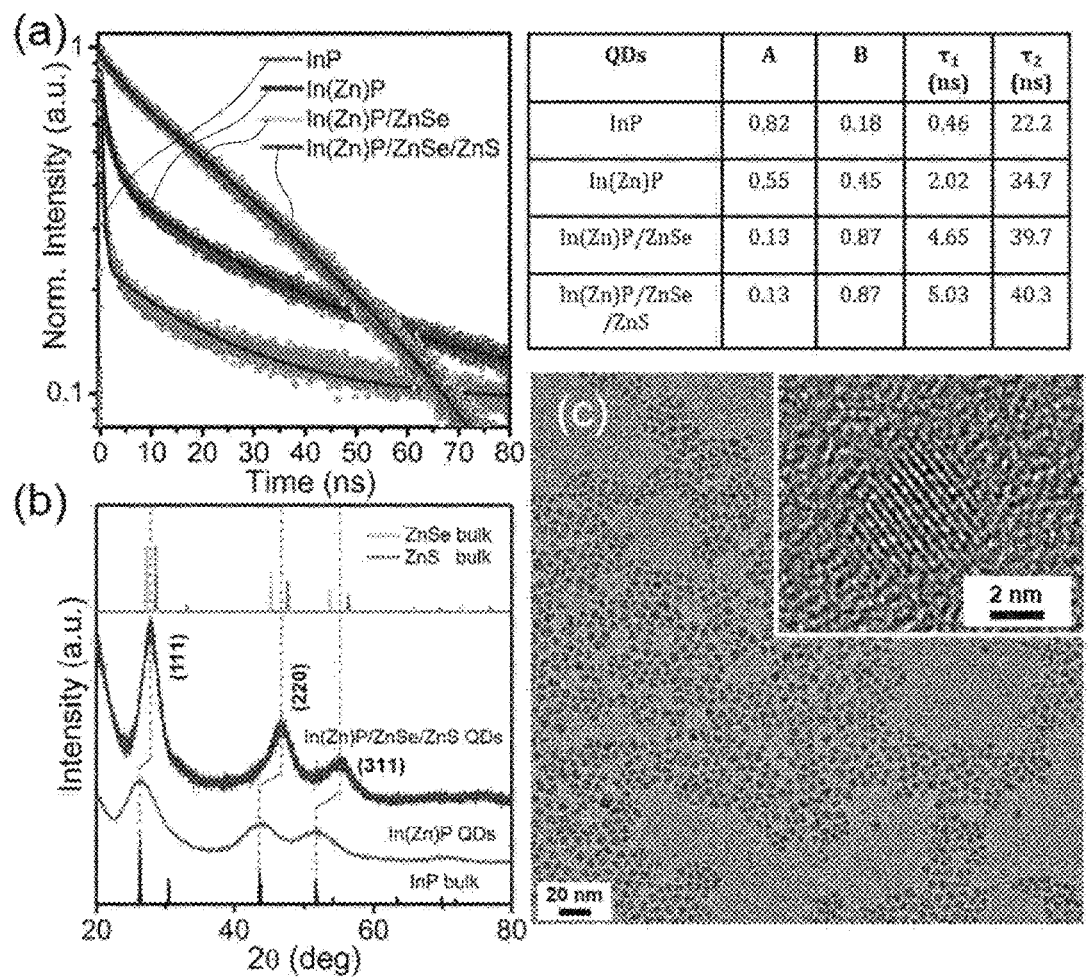
FIGS. 6 and 8-10 are diagrams illustrating quantum dot characteristics of the present invention.

FIG. 6 is a graph for comparing a quantum dot with a quantum dot having a shell formed thereon and a photograph.

FIG. 6(a) is a graph illustrating the TRPL (time-resolved photoluminescence) data of InP, In(Zn)P, In(Zn)P/ZnSe, and In(Zn)P/ZnSe/ZnS.

It is confirmed that In(Zn)P quantum dots have a superior efficiency than InP quantum dots and In(Zn)P/ZnSe and In(Zn)P/ZnSe/ZnS quantum dots having a shell formed thereon have a superior efficiency than In(Zn)P quantum dots in the photoluminescence over time.

FIG. 6(b) is a graph illustrating the XRD patterns of In(Zn)P and In(Zn)P/ZnSe/ZnS.

It is confirmed that a higher intensity is exhibited when a ZnSe/ZnS shell is formed.

FIG. 6(c) is a transmission electron microscopic (TEM) image of In(Zn)P/ZnSe/ZnS quantum dots.

Referring to FIG. 6, it is confirmed that surface defects are efficiently removed, the spinning recombination speed increases, and the PL intensity increases when multiple shells are formed.

Figure 8:
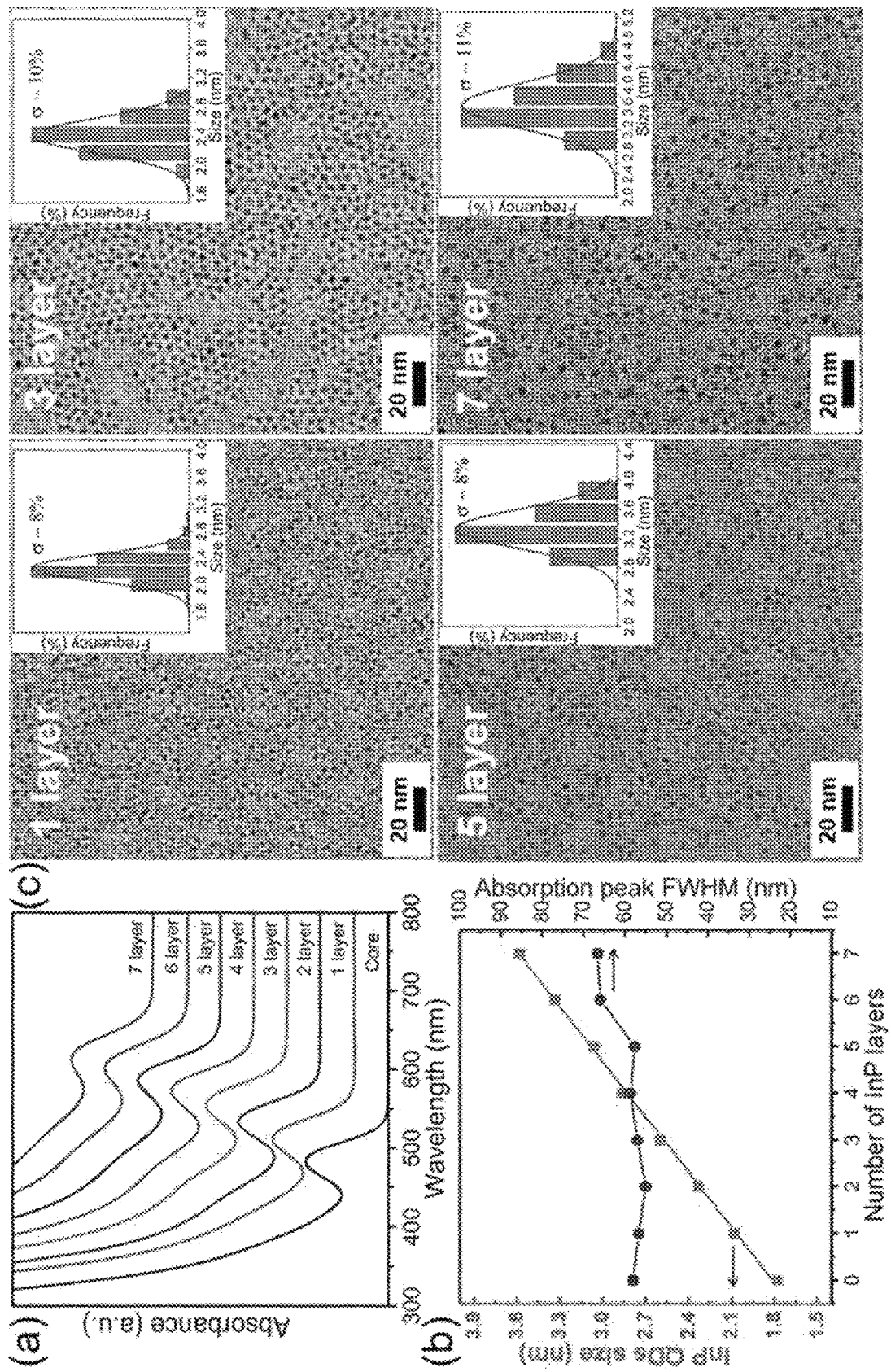

FIG. 8 is a graph illustrating the absorption of quantum dots grown by using SILAR.

FIG. 8(a) is a graph illustrating the absorbance of quantum dots obtained by repeatedly conducting the SILAR cycle one to seven times depending on the wavelength.

Referring to FIG. 8(a), as the InP quantum dots are repeatedly subjected to the SILAR cycle, a higher absorbance can be obtained at each wavelength and the absorption peak can be adjusted at from 480 nm to 615 nm.

FIG. 8(b) is a graph illustrating the InP quantum dot size and FWHM absorbance peak depending on the number of InP layers.

Referring to FIG. 8(b), it is confirmed that the InP quantum dots are uniformly grown from 1.8 nm to 3.6 nm by being repeatedly subjected to the SILAR cycle and the FWHM absorbance peak also increases as the number of layers increases.

FIG. 8(c) is a transmission electron microscopic (TEM) image of InP quantum dots grown through the SILAR method.

Referring to FIG. 8, it is confirmed that the size and size distribution of InP quantum dots can be controlled through the SILAR method.

Figure 9:
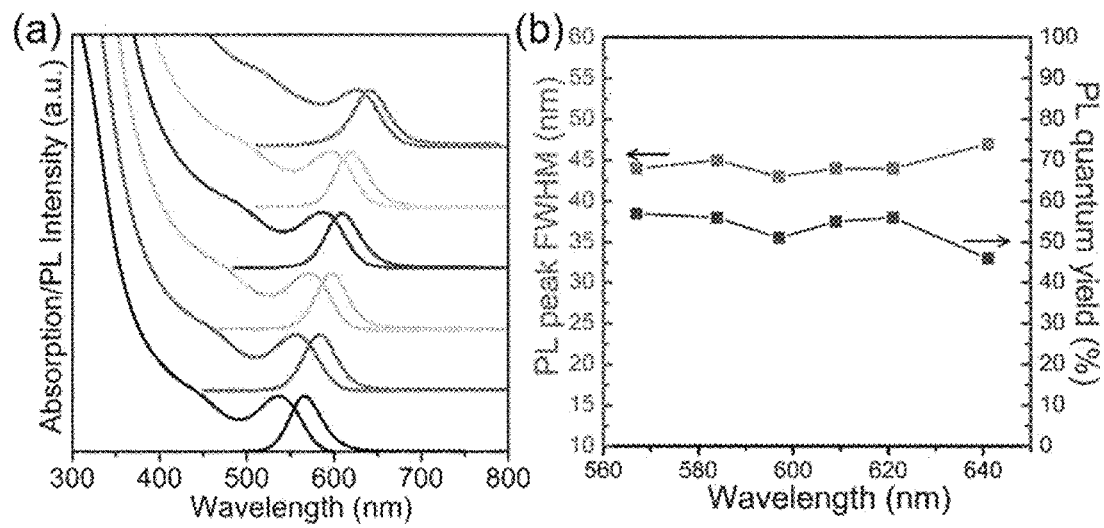

FIG. 9 is a graph of absorbance and PL peak depending on the wavelength.

FIG. 9(a) is a graph of absorbance and PL intensity of InP/ZnSe/ZnS core-shell quantum dots grown using the SILAR method.

Referring to FIG. 9(a), light emission can be continuously adjusted at from 567 nm to 641 nm even after the shell is formed on the core.

FIG. 9(b) is a graph illustrating the PL peak FWHM and PL quantum yield depending on the wavelength.

Referring to FIG. 9(b), it is confirmed that all the quantum dots have a light emission FWHM of about 44 nm and a quantum yield of 50%.

Figure 10:
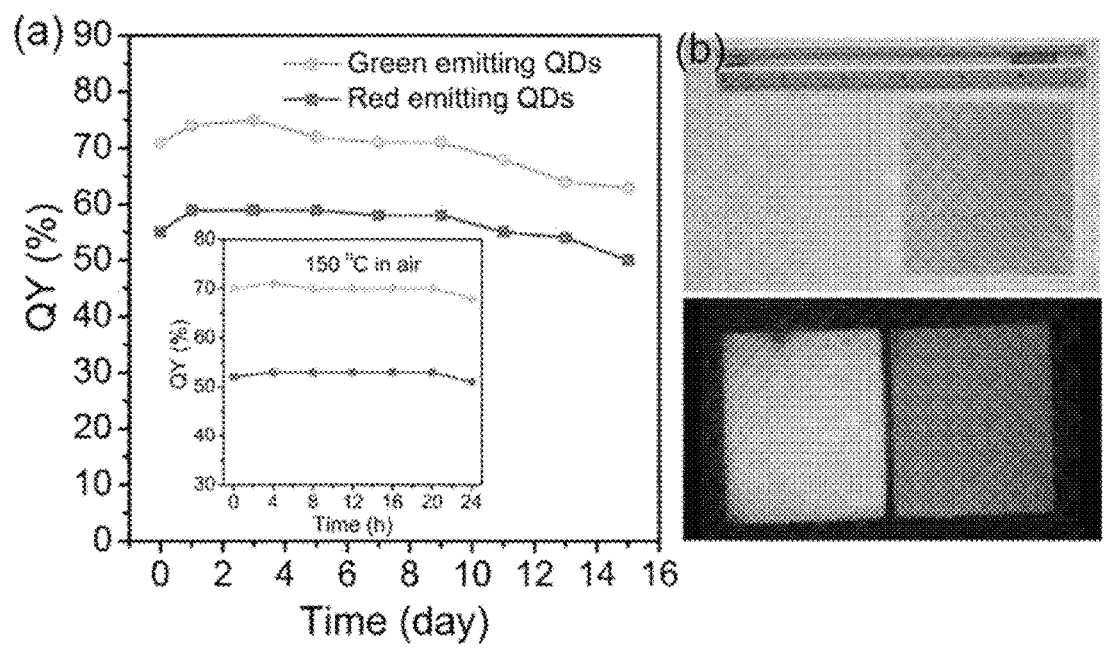

FIG. 10 is a graph and a photograph which illustrate the quantum yield of quantum dots emitting green and red over time.

FIG. 10(a) is a graph illustrating the quantum yield of quantum dots emitting green and red at room temperature and an atmosphere of 150° C. over time.

Referring to FIG. 10(a), the quantum dots of the present invention maintained the quantum yield for 10 days to exhibit excellent stability and the quantum yield slightly decreased after 15 days.

It was also observed that the quantum yield was maintained when the quantum dots were exposed at 150° C. for 24 hours.

FIG. 10(b) is an image illustrating bright and uniform light emission from a film when a quantum dot film prepared by mixing a quantum dot monomer with a resin is irradiated with ultraviolet light.

Referring to FIG. 10, excellent stability of the quantum dots is confirmed.

Figure 11:
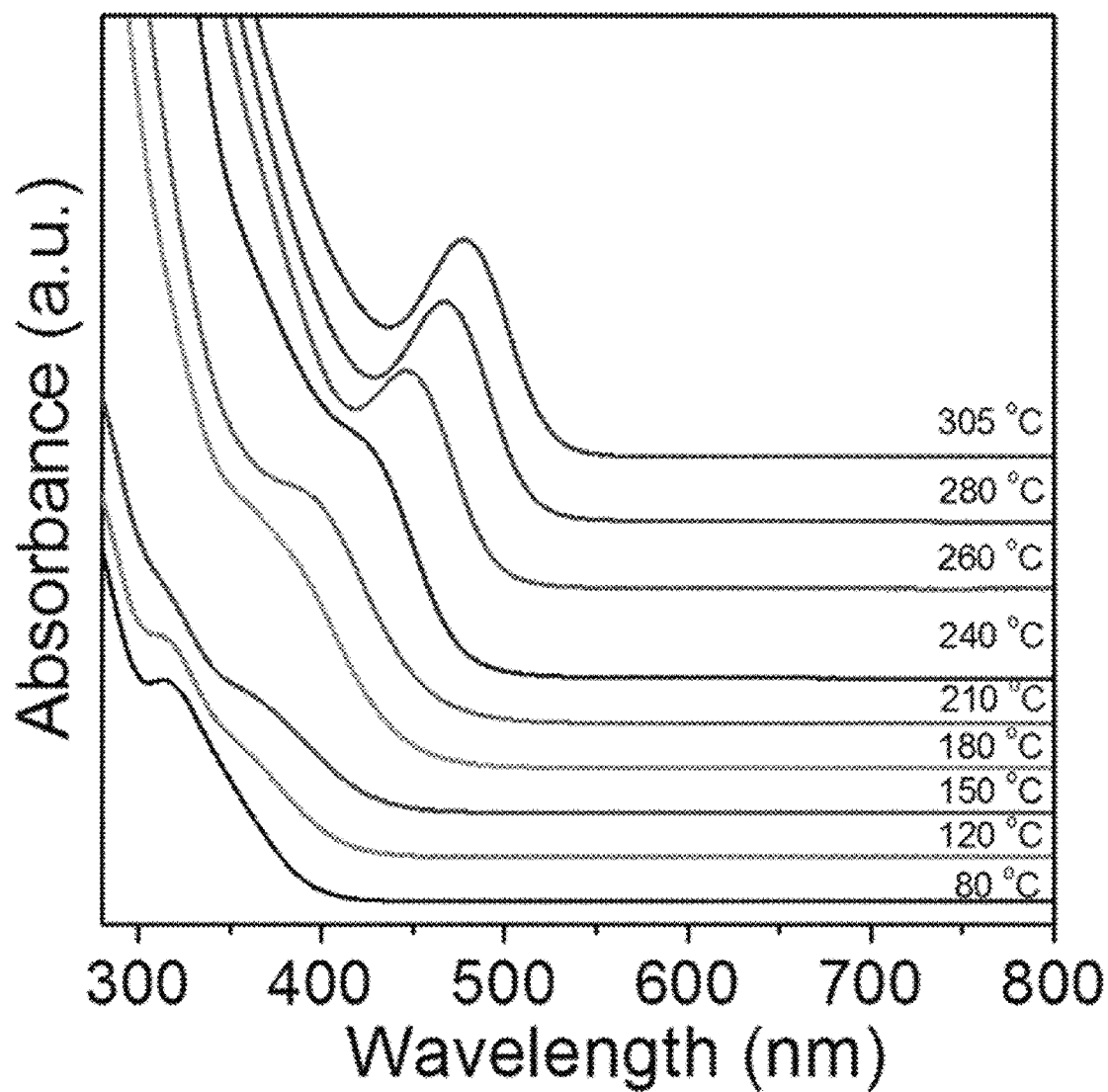
FIG. 11 is a graph illustrating the absorbance depending on the wavelength at various temperatures during a heating-up method of the present invention.

FIG. 11 is a graph illustrating the absorbance depending on the wavelength at various temperatures during a heating-up method of the present invention.

Referring to FIG. 11, it is confirmed that the absorbance increases at each wavelength as the temperature increases.

Figure 12:
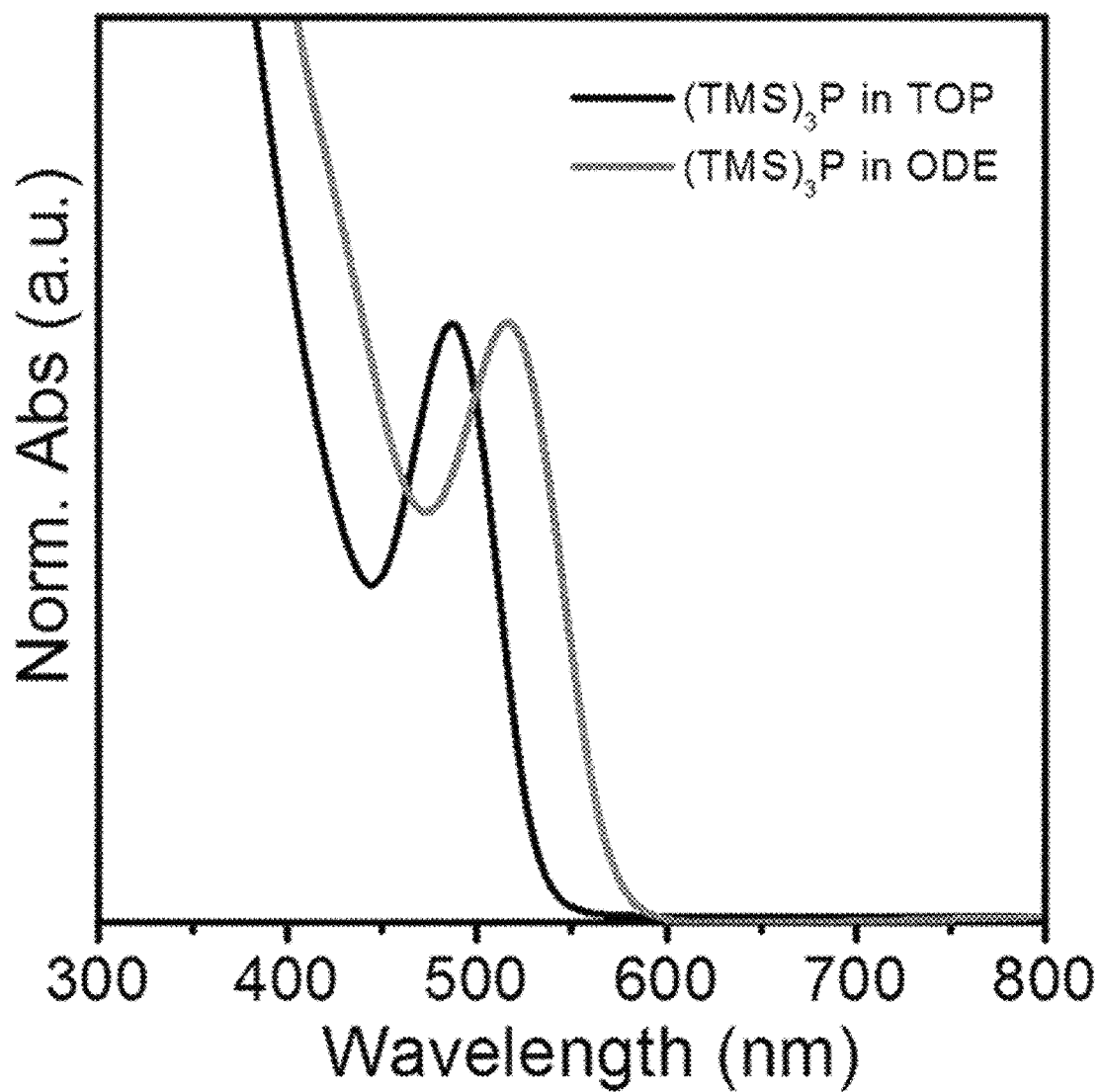
FIG. 12 is a graph illustrating the absorption spectra of InP QDs synthesized in the presence and absence of TOP.

FIG. 12 is a graph illustrating the absorption spectra of InP QDs synthesized in the presence and absence of TOP.

Referring to FIG. 12, it is confirmed that a superior absorbance is obtained when using (TMS)3P in TOP than when using (TMS)3P in ODE, and (TMS)3P in TOP was used in Preparation Example 1 of the present invention.

Figure 13:
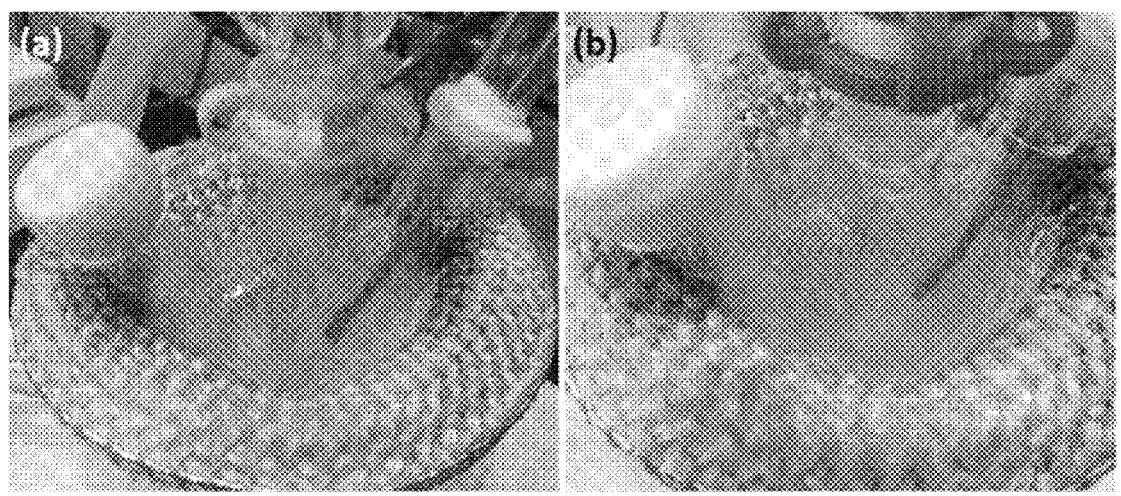
FIG. 13 is a photograph illustrating an InP reaction mixture at 120° C.

FIG. 13 is a photograph illustrating an InP reaction mixture at 120° C.

Referring to FIG. 13 is a photograph illustrating the reaction mixture while the InP quantum dots grow at 120° C. From FIG. 13(b), it is confirmed that (TMS)3P is involved in the reaction and the nucleation and growth are faster when the reaction is conducted in the absence of TOP.

Figure 14:
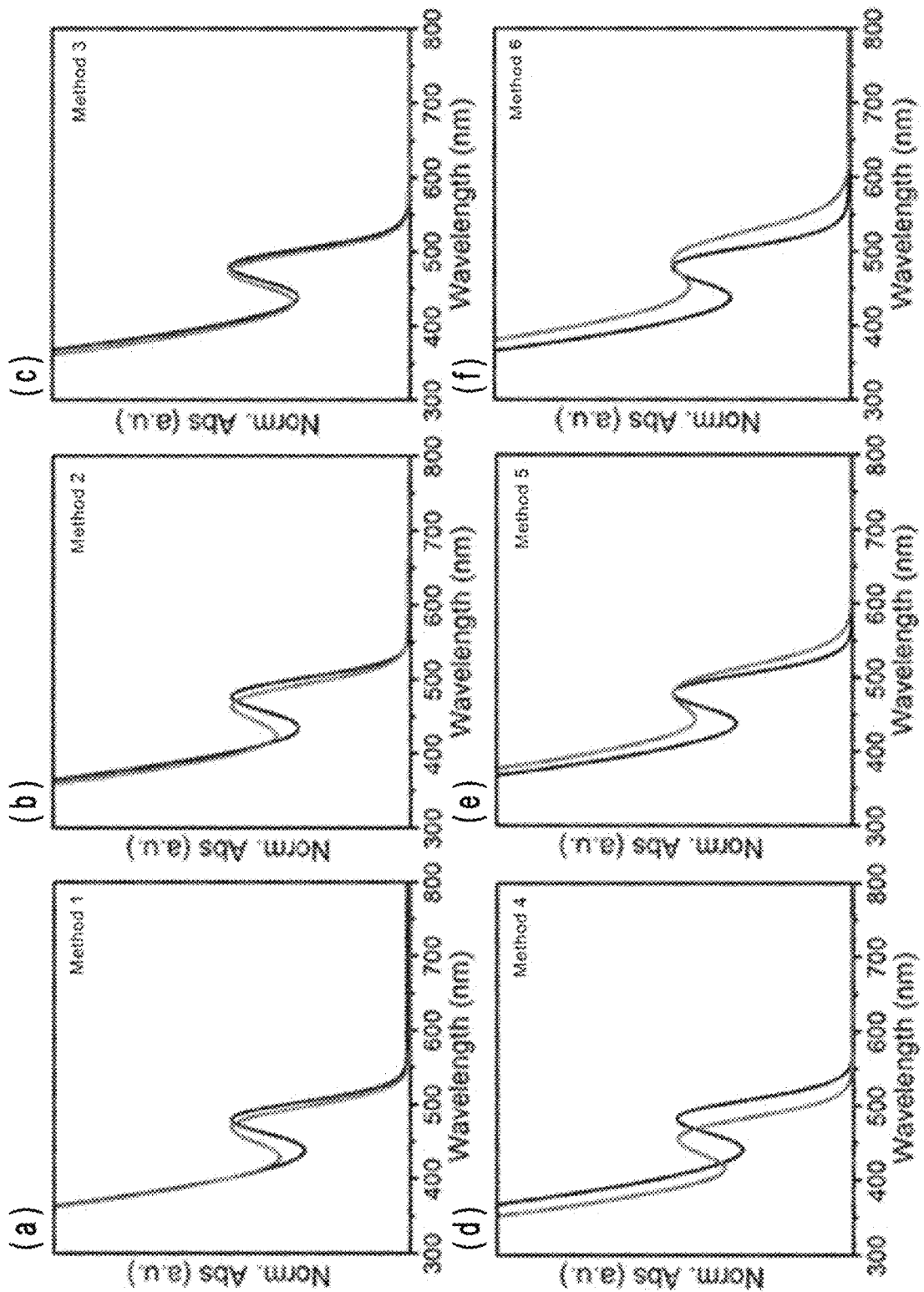
FIG. 14 is a graph illustrating the absorption spectra of InP quantum dots before and after the addition of different Zn precursors.

FIG. 14 is a graph illustrating the absorption spectra of InP quantum dots before and after the addition of different Zn precursors.

Table 1 presents the results on the absorption and photoluminescence characteristics of InP QD and InP/ZnSe/ZnS QD using different SILAR coating methods.

As can be seen from FIG. 14 and Table 1, the blue shift and the absorption spectrum are wider in the case of In(Zn)P QDs containing a Zn precursor.

Hence, referring to FIG. 14, it is confirmed that non-uniform etching of the InP core is solved by the addition of a zinc precursor.

Figure 15:
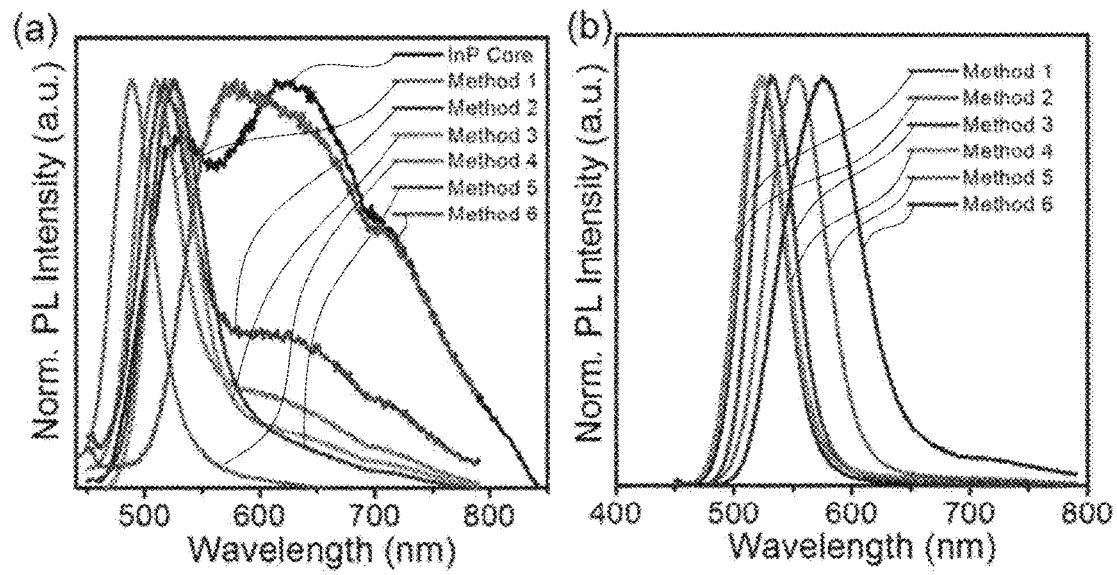
FIG. 15 is a graph illustrating the light emission spectra of InP after the addition of Zn and InP/ZnSe/ZnS QDs synthesized of the present invention.

FIG. 15 is a graph illustrating the light emission spectra of InP after the addition of Zn and InP/ZnSe/ZnS QDs synthesized of the present invention.

Referring to FIG. 15 is a graph illustrating the light emission spectrum of InP quantum dots after the addition of Zn using the SILAR method and FIG. 15(b) is a graph illustrating the light emission spectrum of InP/ZnSe/ZnS QDs using the SILAR method. Comparing FIGS. 15(a) with 15(b), it is confirmed that the graph in 15(b) for the InP/ZnSe/ZnS QDs of the present invention is more clear.

Figure 16:
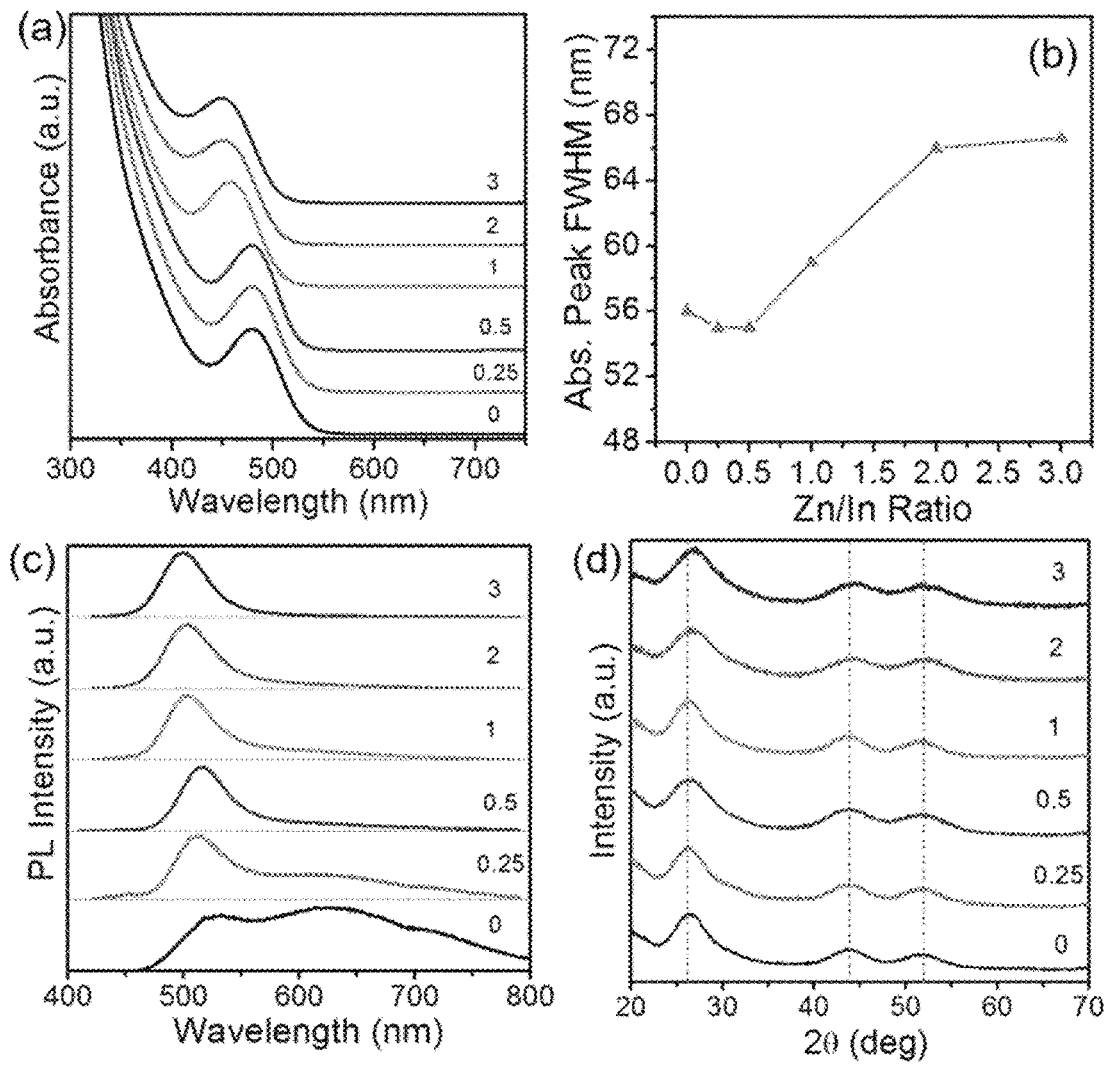
FIG. 16 is a graph illustrating the characteristics of In(Zn)P QDs synthesized to have different Zn: In ratios of the present invention.

FIG. 16 is a graph illustrating the characteristics of In(Zn)P QDs synthesized to have different Zn:In ratios of the present invention.

From FIG. 16(a), it is confirmed that a higher absorbance is obtained at each wavelength as the ratio of zinc precursor increases from 0.0 to 3.0.

TABLE 1

| | Zinc precursor | Injection Temp | Abs. Peak position (nm) | | Abs. Peak FWHM(nm) | | PL characteristics of InP/ZnSe/ZnS QDs | |
|---|---|---|---|---|---|---|---|---|
| | | | Core | After Zn | Core | After Zn | Wavelength (nm) | FWHM (nm) |
| Method 1 (Purified InP QDs were used) | Zinc stearate | RT | 479 | 468 | 55 | 65 | 524 | 44 |
| Method 2 | Zinc stearate | RT | 477 | 464 | 57 | 66 | 522 | 47 |
| Method 3 | Zinc stearate | 305° C. | 479 | 473 | 56 | 60 | 531 | 43 |
| Method 4 | Zinc oleate | RT | 481 | 455 | 58 | 63 | 524 | 46 |
| Method 5 | Zinc oleate | 305° C. | 479 | 479 | 58 | 70 | 552 | 56 |
| Method 6 | ZnCl$_2$ | 305° C. | 479 | 486 | 59 | 72 | 575 | 78 |

Table 1 presents the measured and recorded values of the absorbance peaks, FWHM absorbance peaks, and PL characteristics of quantum dots prepared under different conditions of zinc precursor.

In Method 1 of Table 1 above, zinc stearate was used as a zinc precursor when preparing the quantum dots in Comparative Example 1.

In Method 2 of Table 1, zinc stearate was used as a zinc precursor when preparing the core in Preparation Example 1.

In Method 3 of Table 1, zinc stearate was used as a zinc precursor and the temperature was set to 305° C. when preparing the core in Preparation Example 1.

In Method 4 of Table 1, zinc oleate was used as a zinc precursor when preparing the core in Preparation Example 1.

In Method 5 of Table 1, zinc oleate was used as a zinc precursor and the temperature was set to 305° C. when preparing the core in Preparation Example 1.

In Method 6 of Table 1, ZnCl$_2$ was used as a zinc precursor and the temperature was set to 305° C. when preparing the core in Preparation Example 1.

The black graphs in FIG. 14 illustrate the absorbance of InP QDs depending on the wavelength and the red graphs in FIG. 14 illustrate the absorbance of quantum dots to which a Zn precursor is added when preparing the InP QDs depending on the wavelength.

From FIG. 16(b), it is confirmed that the FWHM absorbance also sharply increases from 0.5 to 2.0 as the ratio of zinc precursor increases from 0.0 to 3.0.

FIG. 16(c) illustrates the PL intensity depending on the wavelength. It is confirmed that the PL intensity also increases as the ratio of zinc precursor increases from 0.0 to 3.0.

From FIG. 16(d) as well, it is confirmed that the intensity increases at each 2θ (deg) as the ratio of zinc precursor increases from 0.0 to 3.0.

Hence, referring to FIG. 16, it can be seen that an effect of exhibiting an excellent absorbance and an excellent PL intensity is obtained as the ratio of zinc precursor increases when the Zn:In ratio is 0, 0.25, 0.5, 1, 2, and 3.

Figure 17:
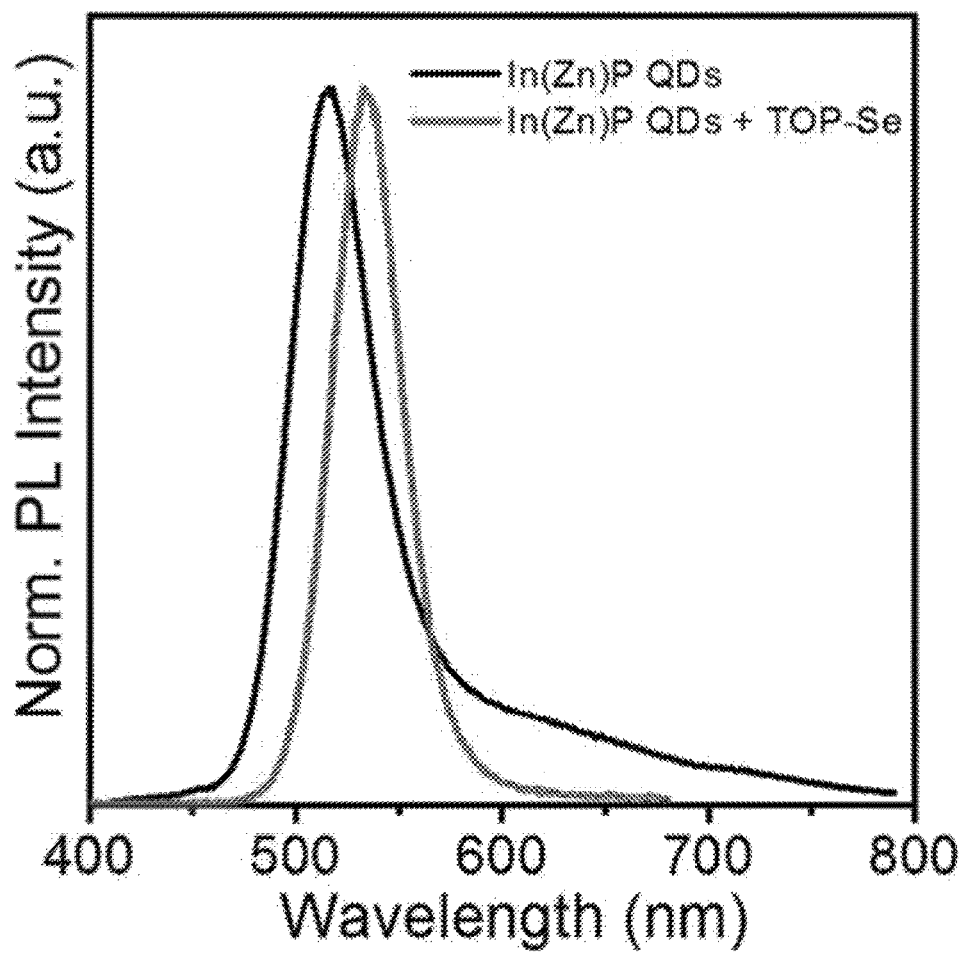
FIG. 17 is a graph illustrating the photoluminescence spectra of In(Zn)P QDs and In(Zn)P/ZnSe QDs of the present invention.

FIG. 17 is a graph illustrating the photoluminescence spectra of In(Zn)P QDs and In(Zn)P/ZnSe QDs of the present invention.

Referring to FIG. 17, the photoluminescence spectra of In(Zn)P QDs and In(Zn)P/ZnSe QDs are confirmed, and it is confirmed that (In(Zn)P QDs+TOP—Se) indicating the In(Zn)P/ZnSe QDs of the present invention emits light in a more clear wavelength range when comparing In(Zn)P QDs+TOP—Se of the present invention with In(Zn)P QDs.

Figure 18:
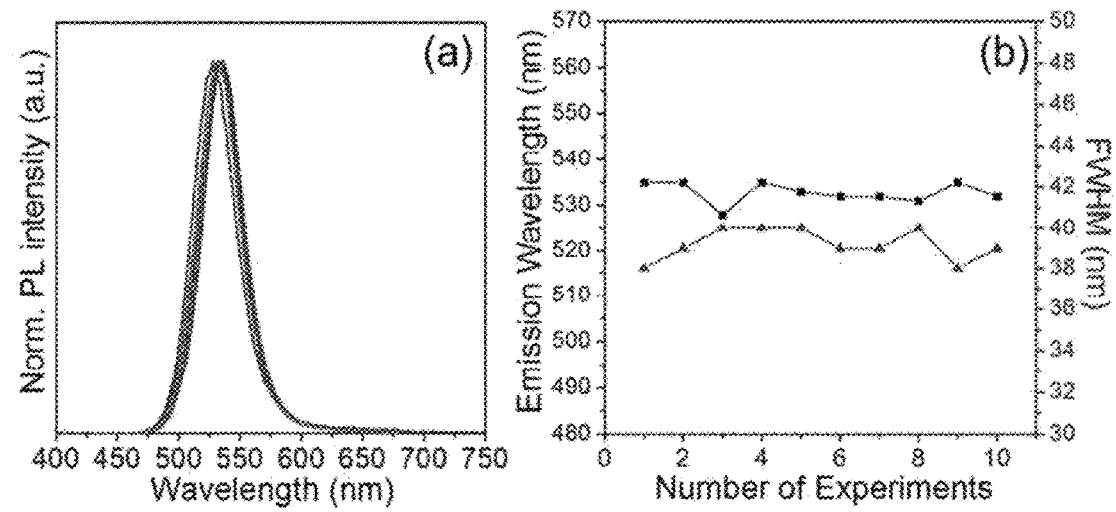
FIG. 18 is a graph illustrating the results for a reproducibility test of In(Zn)P/ZnSe/ZnS QDs synthesis of the present invention.

FIG. 18 is a graph illustrating the results for a reproducibility test of In(Zn)P/ZnSe/ZnS QDs synthesis of the present invention.

Referring to FIG. 18, the photoluminescence spectrum of In(Zn)P/ZnSe/ZnS QDs of the present invention is confirmed and the light emission wavelength and FWHM value can be obtained from FIG. 18(a). In addition, the FWHM value and emissivity of In(Zn)P/ZnSe/ZnS QDs of the present invention at the time of 10 consecutive experiments are confirmed from FIG. 18(b).

According to an embodiment of the present invention, the synthesis of In(Zn)P/ZnSe/ZnS quantum dots capable of emitting light which is tunable and has a high color purity at a wavelength of from 380 nm to 800 nm is provided.

In addition, an effect that the light emission efficiency, color purity, and color reproducibility are excellent in a wide light emission region of from the visible light region to the near infrared region can be obtained by an In(Zn)P core.

In addition, an effect that the defects on the surface and inside of the core due to the external environment are prevented can be obtained as a ZnSe/ZnS shell is formed on the In(Zn)P core.

In addition, an effect that the quantum efficiency is higher than the case of a single shell, the electron transporting property is improved, and the electron mobility is thus superior can be obtained as ZnSe/ZnS multiple shells are formed on the In(Zn)P core.

In addition, the quantum dots can be uniformly grown and a narrow size distribution can be obtained in the absorption spectrum as a heating-up method is used.

In addition, it is possible to solve the problem that the absorption characteristics deteriorate and a wider light emission line width is caused occurring in a conventional manufacturing method, to smooth the interface between the core and the shell, and thus to facilitate uniform coating of the ZnSe shell as zinc (Zn) is incorporated into the core during the core formation.

In addition, it is possible to obtain a narrow light emission FWHM of about 36 nm and a high quantum yield (QY) of 67% or more by forming In(Zn)P/ZnSe/ZnS core-shell quantum dots.

It should be understood that the effects of the present invention are not limited to the effects described above but include all effects that can be deduced from the detailed description of the present invention or the constitution of the invention described in the claims.

The foregoing description of the present invention is intended to be illustrative, and it will be understood by those skilled in the art that the invention can be easily modified in other specific forms without changing the technical idea or essential features of the present invention. It is therefore to be understood that the above-described embodiments are illustrative in all aspects and not restrictive. For example, each component described as a single entity may be implemented in a distributed form, and components described as being distributed may also be implemented in a combined form.

The scope of the present invention is defined by the appended claims, and all changes or modifications derived from the meaning and scope of the claims and their equivalents should be construed as being included within the scope of the present invention.

What is claimed is:

1. A method of manufacturing a quantum dot, the method comprising:
   preparing a mixture by dissolving an indium precursor and a first zinc precursor in an acid;
   forming an In(Zn)P-based core by adding a phosphorus compound to the mixture;
   forming a first shell coated on the In(Zn)P-based core by adding a selenium compound and a second zinc precursor to the mixture; and
   forming a second shell coated on the first shell by adding a sulfur compound and a third zinc precursor to the mixture;
   wherein:
   the first shell is formed of ZnSe and the second shell is formed of ZnS; and
   the step of preparing of the mixture is conducted in a vacuum at from 100° C. to 140° C. for 6 hours or longer.

2. The method of manufacturing a quantum dot according to claim 1, wherein the indium precursor includes indium acetate or indium acetylacetonate.

3. The method of manufacturing a quantum dot according to claim 1, wherein at least one of the first zinc precursor, the second zinc precursor, and the third zinc precursor is different from the other.

4. The method of manufacturing a quantum dot according to claim 1, wherein the acid includes a carboxylic acid ligand.

5. The method of manufacturing a quantum dot according to claim 4, wherein the carboxylic acid ligand includes at least one of palmitic acid, stearic acid, myristic acid, or oleic acid.

6. The method of manufacturing a quantum dot according to claim 1, wherein the first zinc precursor is injected by from 0.5 mmol to 2 mmol based on 1 mmol of the indium precursor in the preparing of the mixture.

7. A method of manufacturing a quantum dot, the method comprising:
   preparing a mixture by dissolving an indium precursor and a first zinc precursor in an acid;
   forming an In(Zn)P-based core by adding a phosphorus compound to the mixture;
   forming a first shell coated on the In(Zn)P-based core by adding a selenium compound and a second zinc precursor to the mixture; and
   forming a second shell coated on the first shell by adding a sulfur compound and a third zinc precursor to the mixture;
   wherein:
   the first shell is formed of ZnSe and the second shell is formed of ZnS; and
   the acid is injected by from 3.8 mmol to 4 mmol based on 1 mmol of the indium precursor in the preparing of the mixture.

8. The method of manufacturing a quantum dot according to claim 1, wherein:
   the first zinc precursor includes zinc acetate;
   the second zinc precursor includes zinc stearate; and
   the third zinc precursor includes zinc oleate.

9. The method of manufacturing a quantum dot according to claim 1, wherein the phosphorus compound is injected by from 0.5 mmol to 1 mmol based on 1 mmol of the indium precursor in the forming of the core.

10. The method of manufacturing a quantum dot according to claim 1, wherein the phosphorus compound includes tris(trimethylsilyl):phosphine ((TMS)3P).

11. The method of manufacturing a quantum dot according to claim 1, wherein the phosphorus compound is added and a state is then maintained at a temperature of from 200° C. to 400° C. for from 10 minutes to 30 minutes in the forming of the core.

12. The method of manufacturing a quantum dot according to claim 1, wherein the forming of the core comprises:
   conducting a heating-up method.

13. The method of manufacturing a quantum dot according to claim 12, wherein the heating-up method is conducted at a temperature of 400° C. or lower.

14. The method of manufacturing a quantum dot according to claim 1, wherein the selenium compound includes TOP (trioctylphosphine)Se.

15. The method of manufacturing a quantum dot according to claim 1, wherein the sulfur compound includes 1-dodecanethiol (1-DDT).

16. A method of manufacturing a quantum dot, the method comprising:
    preparing a mixture by dissolving an indium precursor and a first zinc precursor in an acid;
    forming an In(Zn)P-based core by adding a phosphorus compound to the mixture;
    forming a first shell coated on the In(Zn)P-based core by adding a selenium compound and a second zinc precursor to the mixture; and
    forming a second shell coated on the first shell by adding a sulfur compound and a third zinc precursor to the mixture;
wherein:
    the first shell is formed of ZnSe and the second shell is formed of ZnS; and
    the first shell and the second shell are formed by conducting a successive ion layer adsorption and reaction (SILAR) method.

17. The method of manufacturing a quantum dot according to claim 16, wherein the SILAR (successive ion layer adsorption and reaction) method is conducted at a temperature of from 200° C. to 400° C.

18. The method of manufacturing a quantum dot according to claim 1, wherein a size of the quantum dot is from 1.6 nm to 6 nm.

19. The method of manufacturing a quantum dot according to claim 1, wherein a light emission wavelength of the quantum dot emits light at a wavelength of from 380 nm to 750 nm.

20. A quantum dot manufactured by the method of manufacturing a quantum dot according to claim 1.

* * * * *